(12) United States Patent
Lerner et al.

(10) Patent No.: US 8,256,754 B2
(45) Date of Patent: Sep. 4, 2012

(54) LIFT PIN FOR SUBSTRATE PROCESSING

(75) Inventors: Alexander N. Lerner, San Jose, CA (US); Mehran Behdjat, San Jose, CA (US); Paula Valdivia, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1219 days.

(21) Appl. No.: 11/955,217

(22) Filed: Dec. 12, 2007

(65) Prior Publication Data
US 2009/0155025 A1 Jun. 18, 2009

(51) Int. Cl.
*B24Q 1/00* (2006.01)
(52) U.S. Cl. ........ 269/54.5; 269/54; 269/54.1; 269/54.3
(58) Field of Classification Search ............ 269/54, 269/54.1, 54.3, 54.5; 118/728, 729; 156/345.51–55; 254/133 R; 414/217
See application file for complete search history.

(56) References Cited

U.S. PATENT DOCUMENTS

| | | | | |
|---|---|---|---|---|
| 1,313,732 | A * | 8/1919 | Raffo | 269/54 |
| 3,534,640 | A * | 10/1970 | Macy | 408/226 |
| 4,212,559 | A * | 7/1980 | Persson | 403/348 |
| 4,741,090 | A * | 5/1988 | Monnier | 29/464 |
| 5,848,670 | A * | 12/1998 | Salzman | 187/272 |
| 5,879,128 | A | 3/1999 | Tietz et al. | |
| 5,900,062 | A | 5/1999 | Loewenhardt et al. | |
| 6,029,966 | A * | 2/2000 | Hertz et al. | 269/266 |
| 6,315,878 | B1 * | 11/2001 | Patadia et al. | 204/298.15 |
| 6,435,798 | B1 * | 8/2002 | Satoh | 414/217 |
| 6,450,346 | B1 * | 9/2002 | Boyle et al. | 211/41.18 |
| 6,515,261 | B1 | 2/2003 | Smargiassi et al. | |
| 6,572,708 | B2 | 6/2003 | Gujer et al. | |
| 6,767,176 | B2 | 7/2004 | Yudovsky et al. | |
| 6,884,319 | B2 * | 4/2005 | Kim | 156/345.52 |
| 6,887,317 | B2 * | 5/2005 | Or et al. | 118/728 |
| 6,935,466 | B2 | 8/2005 | Lubomirsky et al. | |
| 6,958,098 | B2 | 10/2005 | Gujer et al. | |
| 7,204,888 | B2 | 4/2007 | Tran et al. | |
| 7,292,428 | B2 | 11/2007 | Hanawa et al. | |
| 2002/0011204 | A1 | 1/2002 | Gujer et al. | |
| 2003/0000775 | A1 | 1/2003 | Yudovsky et al. | |

(Continued)

FOREIGN PATENT DOCUMENTS
JP 11-340309 12/1999
(Continued)

OTHER PUBLICATIONS

PCT International Search Report and Written Opinion dated Jul. 22, 2009 for International Application No. PCT/US2008/086045.

(Continued)

*Primary Examiner* — George Nguyen
(74) *Attorney, Agent, or Firm* — Patterson & Sheridan, LLP

(57) ABSTRACT

A lift pin is provided for manipulating a substrate above a support surface of a substrate support and uniformly transferring heat from the substrate support to the substrate. The lift pin includes a pin shaft. The pin shaft includes a cross-section having at least three equal edges and round corners configured alternatively. A pin head is an end portion of the pin shaft, wherein the pin head has a convex support surface larger than the cross-section of the pin shaft. A flat portion is disposed on a central area of the convex support surface for directly contacting the substrate.

16 Claims, 2 Drawing Sheets

U.S. PATENT DOCUMENTS

| | | |
|---|---|---|
| 2003/0178145 A1 | 9/2003 | Anderson et al. |
| 2004/0219006 A1 | 11/2004 | Tran et al. |
| 2005/0194100 A1 | 9/2005 | Or et al. |
| 2005/0217586 A1 | 10/2005 | Lubomirsky et al. |

FOREIGN PATENT DOCUMENTS

| | | |
|---|---|---|
| JP | 2001-024047 | 1/2001 |
| JP | 2003-100855 | 4/2003 |
| JP | 2005-311108 | 11/2005 |
| KR | 10-2007-0091842 | 9/2007 |

OTHER PUBLICATIONS

Chinese Office Action dated Jun. 30, 2011 for Chinese Patent Application No. 200880120701.1.

* cited by examiner

LIFT PIN FOR SUBSTRATE PROCESSING

BACKGROUND OF THE INVENTION

1. Field of the Invention

The present invention relates generally to an apparatus for semiconductor processing. More specifically, the invention relates to a lift pin of a substrate support assembly for manipulating a substrate.

2. Description of the Related Art

Integrated circuits have evolved into complex devices that can include millions of components (e.g., transistors, capacitors and resistors) on a single chip. The evolution of chip designs continually requires faster circuitry and greater circuit densities. The demand for greater circuit densities necessitates a reduction in the dimensions of the integrated circuit components.

As the dimensions of the integrated circuit components are reduced (e.g., sub-micron dimensions), particle contamination becomes an increasing problem. One source of particle generation is the lift pins utilized to space a substrate from a substrate support. The lift pins generally reside in guide holes disposed through the substrate support. The lift pins support the substrate upon their top ends and move through the guide holes to actuate the substrate either up or down. One problem that has been observed is the particle generation attributed to contact between the lift pins and the guide holes as the lift pins move through the guide holes.

Thermal processing is also required in the fabrication of silicon and other semiconductor integrated circuits formed in silicon wafers or other substrates. In some thermal process systems, such as Rapid Thermal Processing (RTP), pulsed laser annealing, and dynamic surface annealing (DSA), the substrate support assembly may be used to transfer heat to the substrate. Conventional lift pins located in the guide holes of the substrate support assembly have difficulty transferring heat to the substrate uniformly. Conventional lift pins transfer heat to the substrate either too fast or too slow generating hot spots and cold spots on the substrate surface. Therefore, there is a need for an improved substrate support assembly for substrate processing.

SUMMARY OF THE INVENTION

According to one aspect of the present invention, a lift pin for manipulating a substrate above a support surface of a substrate support is provided. The lift pin includes a pin shaft including a cross-section having at least three equal edges and round corners configured alternatively. A pin head is an end portion of the pin shaft, wherein the pin head has a convex support surface larger than the cross-section of the pin shaft. A flat portion is disposed on a central area of the convex support surface for directly contacting the substrate.

In another aspect, a substrate support assembly for manipulating a substrate above thereof is provided. The substrate support assembly includes a lift pin assembly having a plurality of lift pins, each lift pin including a pin shaft. The pin shaft includes a cross-section having at least three equal edges and round corners configured alternatively. A pin head is an end portion of the pin shaft, wherein the pin head has a convex support surface larger than the cross-section of the pin shaft. A flat portion is disposed on a central area of the convex support surface for directly contacting the substrate. A substrate support has a plurality of pin holes through which the plurality of lift pins are movable for manipulating the substrate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the present invention as recited in the claims are generally directed to a substrate support assembly and lift pins for processing a semiconductor substrate. The lift pins manipulate a substrate above a support surface of a substrate support when the substrate is being placed on or removed from the support surface.

Figure 1:
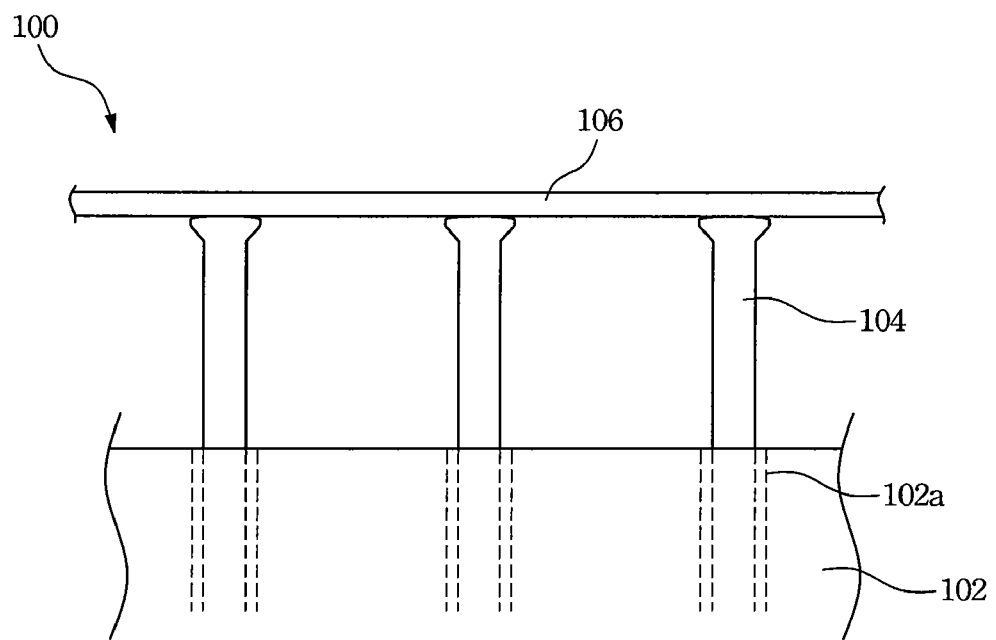
FIG. 1 illustrates a substrate support assembly as described in an embodiment herein.

FIG. 1 illustrates a substrate support assembly 100 as described in an embodiment herein. The substrate support assembly 100 is installed in a chamber where a semiconductor substrate is processed. The substrate support assembly 100 includes a substrate support 102 and a lift pin assembly of more than three lift pins 104. A substrate 106 is positioned on top of the lift pins 104. The lift pins 104 interact with the substrate support 102 via pin holes 102a to position the substrate 106 relative to the substrate support 102. The substrate support 102 can be fabricated from ceramic materials.

Figure 2:
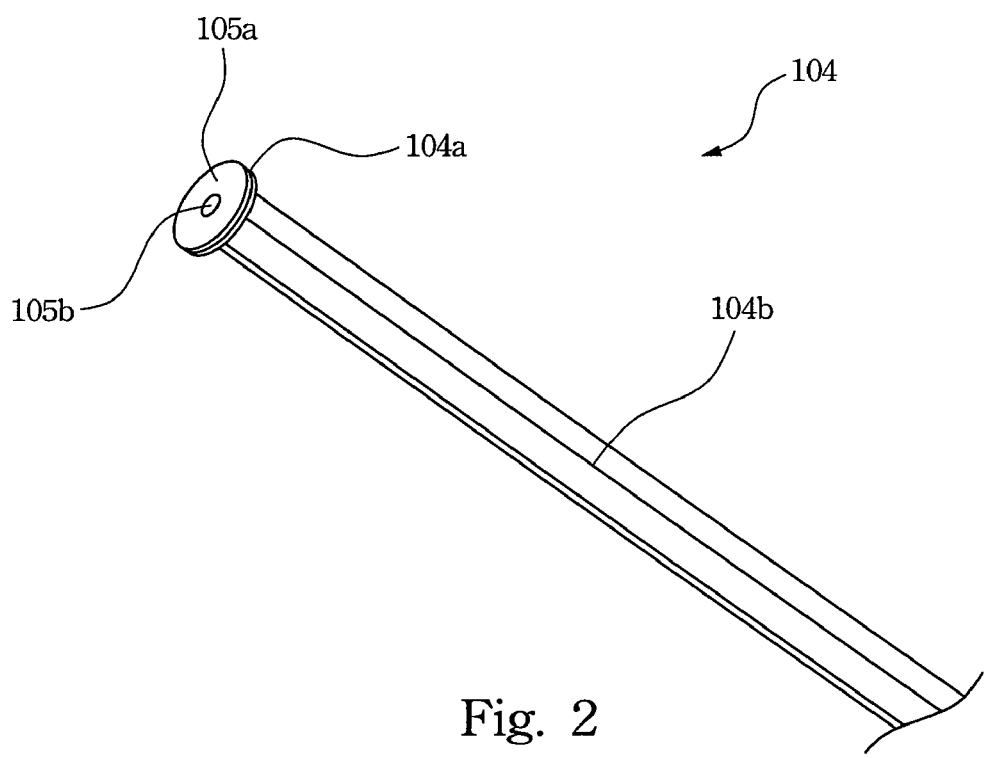
FIG. 2 illustrates an enlarged view of a lift pin of the substrate support assembly of FIG. 1.
Figure 3:
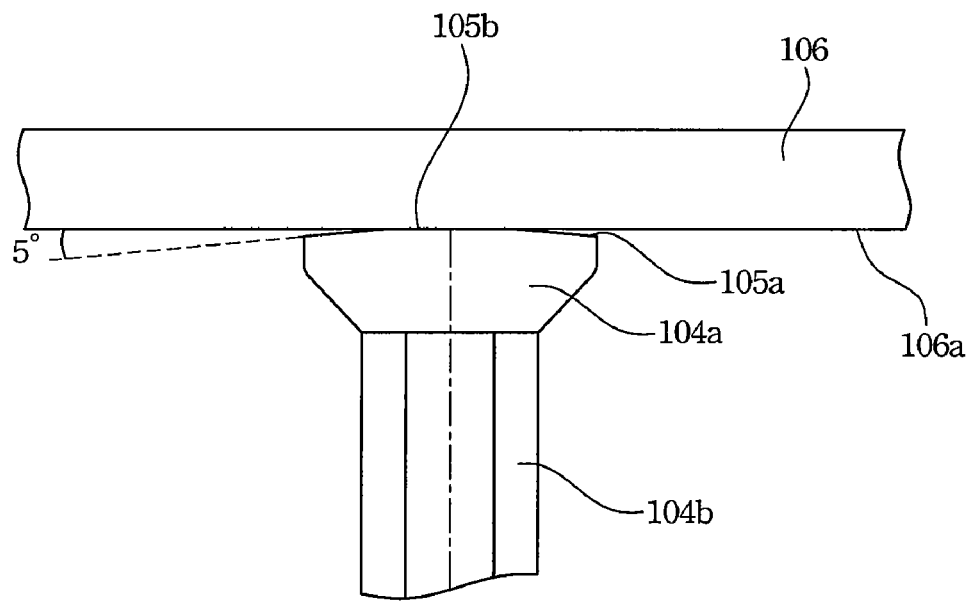
FIG. 3 illustrates an enlarged view of the lift pin in contact with a substrate as shown in FIG. 1.
Figure 4:
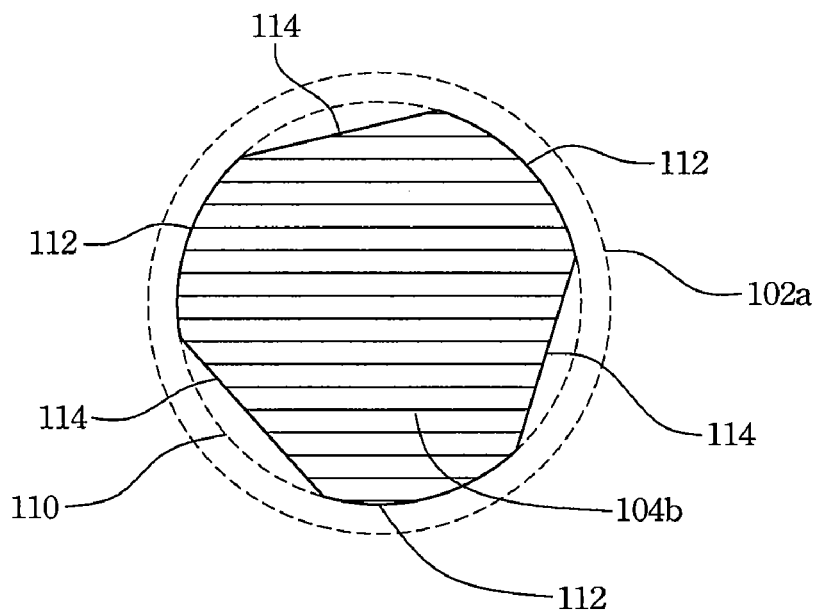
FIG. 4 illustrates a cross-section of the lift pin within a pin hole as described in an embodiment herein.

In order to provide reduced particle generation and uniform heating to the substrate 106 via the lift pins 104, improved designs of the lift pins 104 are illustrated in FIG. 2, FIG. 3 and FIG. 4.

FIG. 2 illustrates an enlarged view of the lift pin 104 of the substrate support assembly 100 of FIG. 1. The lift pin 104 includes a pin shaft 104b and a pin head 104a. The pin head 104a is the end portion of the pin shaft 104b for supporting the substrate 106. The pin head 104a has a convex support surface 105a, where a flat portion 105b is located on a central, top area thereof. The convex support surface 105a and the flat portion 105b are generally circular areas, but other shapes may be applied. The lift pins 104 are typically comprised of alumina or other suitable material. A cylindrical outer surface of the lift pin 104 may additionally be treated to reduce friction and surface wear. For example, the cylindrical outer surface of the lift pin 104 may be hard chromium plated or electropolished to reduce friction and make the outer surface harder, smoother, and more resistant to scratching and corrosion.

FIG. 3 illustrates an enlarged view of the lift pin in contact with a substrate as shown in FIG. 1. One purpose of the lift pin head 104a is to transfer heat from the substrate support 102 to the substrate 106. The flat portion 105b of the convex support surface 105a is in contact with a bottom surface 106a of the substrate 106 to serve as a heat-transferring interface. The size of the flat portion 105b can be adjusted such that a desired amount of heat can be uniformly transferred to the substrate 106 to avoid the presence of hot spots and cold spots on the substrate surface. In this embodiment, the size of the flat portion 105b is smaller than the cross-section area of the pin shaft 104b. When the substrate 106 is in contact with the flat portion 105b, an angle between the convex support surface 105a and the bottom surface 106a of the substrate 106 is about 5 degrees.

FIG. 4 illustrates a cross-section of the pin shaft 104b within a circular pin hole 102a of the substrate support 102. The cross-section design of the pin shaft 104b allows for a reduced contact between the pin shaft 104b and an inner wall of the pin hole 102a (compared to a circular cross-section). In this embodiment, the cross-section design of the pin shaft 104b is an equilateral triangle with three round corners 112. Boundaries of the cross-section design are equal edges 114 and three round corners 112 configured alternatively. Three round corners 112 are part of a circular circumference 110. In an alternate embodiment, the cross-section design of the pin shaft 104b may have more equal edges (such as four equal edges) and more round corners (such as four round corners) configured alternatively, and the round corners are part of a circular circumference. The design of the cross-section of the pin shaft 104b reduces friction and heat transferring between the lift pin 104 and the pin hole 102a, such that the lift pin 104 moves smoothly through the pin hole 102a, and heat can be uniformly transferred from the substrate support 102 to the substrate 106 without wasting too much heat by contacting the inner walls of the pin hole 102a.

According to the forgoing embodiments, the improved lift pin design has the advantages of reduced particle generation and improved heat transfer between the lift pin head and the substrate support to avoid hot spots and cold spots on the substrate surface.

While the foregoing is directed to embodiments of the present invention, other and further embodiments of the invention may be devised without departing from the basic scope thereof, and the scope thereof is determined by the claims that follow.

The invention claimed is:

1. A lift pin for manipulating a substrate above a support surface of a substrate support, the lift pin comprising:
   a pin shaft comprising a cross-section having at least three equal edges and round corners configured alternatively, wherein the round corners are part of a circular circumference;
   a pin head being an end portion of the pin shaft, wherein the pin head has a convex support surface larger than the cross-section of the pin shaft; and
   a flat portion disposed on a central area of the convex support surface for directly contacting the substrate.

2. The lift pin of claim 1, wherein the cross-section of the pin shaft is an equilateral triangle with three round corners.

3. The lift pin of claim 1, wherein the flat portion is smaller than the cross-section of the pin shaft.

4. The lift pin of claim 1, wherein when the flat portion is in contact with the substrate, an angle between the convex support surface and a bottom surface of the substrate is about 5 degrees.

5. The lift pin of claim 1, wherein the flat portion is a circular area.

6. The lift pin of claim 1, wherein the convex support surface is a circular area.

7. The lift pin of claim 1, wherein the pin shaft comprises alumina.

8. A substrate support assembly for manipulating a substrate above thereof, the substrate support assembly comprising:
   a lift pin assembly having a plurality of lift pins, wherein each lift pin comprises:
      a pin shaft comprising a cross-section having at least three equal edges and round corners configured alternatively, wherein the round corners are part of a circular circumference;
      a pin head being an end portion of the pin shaft, wherein the pin head has a convex support surface larger than the cross-section of the pin shaft;
      a flat portion disposed on a central area of the convex support surface for directly contacting the substrate; and
   a substrate support, having a plurality of pin holes through which the plurality of lift pins are movable for manipulating the substrate.

9. The substrate support assembly of claim 8, wherein the pin shaft comprises alumina.

10. The substrate support assembly of claim 8, wherein the substrate support comprises ceramic materials.

11. The substrate support assembly of claim 8, wherein the cross-section of the pin shaft is an equilateral triangle with three round corners.

12. The substrate support assembly of claim 8, wherein the flat portion is smaller than the cross-section of the pin shaft.

13. The substrate support assembly of claim 8, wherein when the flat portion is in contact with the substrate, an angle between the convex support surface and a bottom surface of the substrate is about 5 degrees.

14. The substrate support assembly of claim 8, wherein the flat portion is a circular area.

15. The substrate support assembly of claim 8, wherein the convex support surface is a circular area.

16. The substrate support assembly of claim 8, wherein the lift pin assembly comprises at least three lift pins.

* * * * *